(12) United States Patent
Motzer et al.

(10) Patent No.: US 10,616,996 B2
(45) Date of Patent: Apr. 7, 2020

(54) PRINTED CIRCUIT BOARD FOR A RADAR LEVEL MEASUREMENT DEVICE WITH WAVEGUIDE COUPLING

(71) Applicant: VEGA GRIESHABER KG, Wolfach (DE)

(72) Inventors: Juergen Motzer, Gengenbach (DE); Winfried Rauer, Fischerbach (DE); Daniel Schultheiss, Hornberg (DE); Christoph Mueller, Oppenau (DE)

(73) Assignee: VEGA GRIESHABER KG, Wolfach (DE)

( * ) Notice: Subject to any disclaimer, the term of this patent is extended or adjusted under 35 U.S.C. 154(b) by 0 days.

(21) Appl. No.: 16/209,761

(22) Filed: Dec. 4, 2018

(65) Prior Publication Data

US 2019/0191545 A1 Jun. 20, 2019

(30) Foreign Application Priority Data

Dec. 4, 2017 (EP) .................................... 17205156

(51) Int. Cl.
*G01F 23/284* (2006.01)
*G01S 13/08* (2006.01)
(Continued)

(52) U.S. Cl.
CPC ......... *H05K 1/0243* (2013.01); *G01F 23/284* (2013.01); *G01S 7/032* (2013.01);
(Continued)

(58) Field of Classification Search
CPC .......... G01F 23/284; G01S 13/08; H01P 5/03; H01P 5/08; H01P 5/10; H01P 5/103; H01P 5/107
(Continued)

(56) References Cited

U.S. PATENT DOCUMENTS

| | | | | |
|---|---|---|---|---|
| 5,414,394 A | * | 5/1995 | Gamand | ................. H01P 5/107 333/26 |
| 5,914,684 A | * | 6/1999 | Brettner, III | ............ H01P 5/103 342/153 |

(Continued)

FOREIGN PATENT DOCUMENTS

| | | |
|---|---|---|
| DE | 11 2010 003 585 T5 | 11/2012 |
| DE | 11 2010 003585 T5 | 11/2012 |

(Continued)

OTHER PUBLICATIONS

Extended Search Report dated Jun. 18, 2018, in European Patent Application No. 17205156.7-1001(with English-language translation), 10 pages.

*Primary Examiner* — Xiaoliang Chen

(74) *Attorney, Agent, or Firm* — Oblon, McClelland, Maier & Neustadt, L.L.P.

(57) ABSTRACT

A printed circuit board for a radar level measurement device with a printed circuit board substrate is provided, wherein a microwave signal is coupled via a microwave conductor into a waveguide. A connection region on a front side of the printed circuit board substrate serves to receive the waveguide. A shape of a resonator shell is generated inversely by producing an annular peripheral recess whose wall has an electromagnetically reflecting coating on a rear side of the printed circuit board substrate. The annular peripheral recess on the rear side, together with a region surrounded by the recess, forms a resonator for the injected microwave signals.

16 Claims, 4 Drawing Sheets

(51) Int. Cl.
  *H01P 5/08*   (2006.01)
  *H01P 5/10*   (2006.01)
  *H01P 5/103*  (2006.01)
  *H01P 5/107*  (2006.01)
  *H05K 1/02*   (2006.01)
  *G01S 7/03*   (2006.01)
  *G01S 13/88*  (2006.01)
  *H01P 3/08*   (2006.01)
  *H01P 7/08*   (2006.01)
  *H05K 1/11*   (2006.01)
  *G01S 7/02*   (2006.01)

(52) U.S. Cl.
  CPC .............. *G01S 13/88* (2013.01); *H01P 3/081* (2013.01); *H01P 5/107* (2013.01); *H01P 7/082* (2013.01); *H05K 1/0242* (2013.01); *H05K 1/115* (2013.01); *G01S 2007/027* (2013.01)

(58) Field of Classification Search
  USPC ........ 174/262; 342/124, 153, 175; 73/290 R; 333/26, 34
  See application file for complete search history.

(56) References Cited

U.S. PATENT DOCUMENTS

| | | | |
|---|---|---|---|
| 6,958,662 B1 | 10/2005 | Salmela et al. | |
| 7,752,911 B2* | 7/2010 | Schultheiss | H01P 5/107 333/26 |
| 7,791,278 B2* | 9/2010 | DeVincentis | H01J 65/044 313/582 |
| 9,212,942 B2* | 12/2015 | Weinzierle | H01Q 13/02 |
| 2004/0008952 A1* | 1/2004 | Kragl | C25D 1/00 385/88 |
| 2005/0265403 A1* | 12/2005 | Anderson | H01S 5/143 372/20 |
| 2007/0109178 A1* | 5/2007 | Schultheiss | G01F 23/284 342/124 |

FOREIGN PATENT DOCUMENTS

| | | |
|---|---|---|
| DE | 10 2015 119 690 A1 | 5/2017 |
| DE | 10 2015 119690 A1 | 5/2017 |
| EP | 0 605 046 A1 | 7/1994 |
| EP | 1 327 283 | 7/2003 |
| EP | 1 949 491 B1 | 11/2006 |

\* cited by examiner

PRINTED CIRCUIT BOARD FOR A RADAR LEVEL MEASUREMENT DEVICE WITH WAVEGUIDE COUPLING

REFERENCE TO RELATED APPLICATIONS

This application claims the benefit of the filing date of European Patent Application No. 17 205 156.7 filed on 4 Dec. 2017, the disclosure of which is hereby incorporated herein by reference.

TECHNICAL FIELD

The present disclosure relates to the field of measuring of filling levels, for example in containers. In particular, the disclosure relates to a circuit board for a microwave-based or radar-based level measurement device with a coupling of microwaves into a waveguide.

BACKGROUND

Known level measurement devices increasingly use principles that use the propagation of electromagnetic waves or a reflection behavior and runtime behavior of these waves to determine filling levels. In this case, a high-frequency electromagnetic wave, for example a microwave pulse is emitted by a filling level measuring device in the direction of a surface of a filling material in a container, is reflected by this surface and a filling level is calculated on the basis of the travel-times of the reflected microwave signal.

As a result of further technical developments, in particular of electronics and semiconductor technology, higher frequencies in the upper two-digit gigahertz range are increasingly being used for level measurements. Due to the high frequencies and the resulting physical properties of wave propagation, the requirements for, in particular, the high-frequency components of such level measuring devices are increasing. Frequently, the high frequency assembly is realized on a printed circuit board, which includes the electronics for generating the microwave pulses and the antenna technology.

One possibility of forwarding the generated high-frequency vibrations, for example to an external antenna, exists in the connection of a waveguide. These waveguides can advantageously be used in the frequency range used for forwarding microwave signals. A particular challenge lies in the waveguide transition, i.e., the radiation of the electromagnetic wave from a conductor (for example on the printed circuit board) into the interior of a waveguide and vice versa. This guide may for example be designed as a micro-strip, the end of which extends into a waveguide. The waveguides can be designed, for example, as an air waveguide.

In order to achieve low electrical losses and a good adaptation, in this case, particular technical provisions may be necessary. For example, for low-loss or lossless coupling of the signal, the waveguide must have a resonator at its end whose size, diameter and geometric design minimizes the losses in the range of frequencies used. At the same time, it is desirable to reduce the size of the assemblies and to simplify a structure while maintaining high quality. A technical solution may be to integrate the various functions as possible and to thus obtain simple and inexpensive assemblies. Thus, for example, EP 1 949 491 B1 discloses a waveguide transition in which the resonator of the waveguide is integrated into the printed circuit board.

SUMMARY

The following embodiments may increase mechanical stability and electromagnetic reliability and accuracy of a radar-based or microwave-based level measurement device. At least some of the embodiments described below may be based on the following considerations: In the currently known solutions, a resonator, which is often configured cup-shaped, is required. At the same time, there is the need to arrange this resonator spatially directly at the end of the waveguide in order to realize a lossless or low-loss termination of the waveguide. Now, if the waveguide is usually fit to the circuit board at an angle of 90°, then there is the need to incorporate the resonator in the direction of a substrate of the circuit board. In the past, this is realized, for example, in that a recess or milling in a layer of the printed circuit board substrate in extension of the waveguide is introduced, which then, in order to avoid contamination, usually must be closed with a cover of RF substrate or a plastic lid. This may have disadvantages in terms of the electrical, electromagnetic and mechanical properties of the printed circuit board.

As a solution, a printed circuit board for a radar level measurement device is proposed, which has a non-conductive planar printed circuit board substrate as a carrier material. In addition to the function of mechanical stabilization and the carrier function, the printed circuit board substrate is designed to be insulating for the frequency range of the electromagnetic waves used. This can be, for example, a so-called RF substrate. On the printed circuit board substrate, a microwave guide for coupling a microwave signal is arranged into a waveguide. This may for example be designed as a micro-strip conductor. In an example, this is arranged on the surface of the printed circuit board substrate. In a further example, the microwave guide runs at least partially in an interior of the printed circuit board substrate.

On a front side of the printed circuit substrate, a circumferential, that is annular, for example, round or square, connecting region for receiving a front-side end of a waveguide is arranged. For example, in most cases, the printed circuit substrate is designed as a support plate or base plate, which is often a composite of RF substrate and a base support (e.g., FR4). By this planar design, a front side can be defined, which may have, for example, components. Accordingly, a rear side or a bottom side is often provided for contacts and connections.

In other words, an annular connection region means an area on the front side of the printed circuit board substrate which, for example, makes direct contact with the waveguide or else with a wall of a waveguide or permits a corresponding mechanical reception. Under annular is to be understood here that this area adapts at least partially in its general shape to a cross-sectional shape of the waveguide. If, for example, a cross-sectional shape of the waveguide is designed circular, then the connection area is also modeled approximately circular.

In an example, the connection area is designed rectangular to accommodate a waveguide of rectangular cross section. The waveguide can be mechanically fixed by appropriate mechanical means or in combination with electrical contact. For this purpose, the waveguide can be glued, screwed or soldered to the connection area, for example.

One end of the microwave guide protrudes into the connection area so that microwave signals can pass from the microwave guide into the waveguide and vice versa. In one example, one end of the microwave guide is located approximately in the middle of the cross section of the waveguide. In other words, the end of the microwave guide functions like an antenna which radiates the microwave signals into the waveguide or receives the signals from the waveguide. In an example, the microwave guide is routed within the printed circuit board substrate, which may obviate the need for making a separate recess for insulating the microwave guide at the end of the waveguide.

On a rear side of the printed circuit board substrate, opposite to the annular connecting area, an annular recess, for example corresponding to the cross-sectional area of the waveguide, is arranged in the direction of the waveguide. In principle, the cross-sectional area of the connection area can make a step in comparison to the cross-sectional area of the waveguide, since the rear area is filled with a dielectric and thus could be smaller.

In other words, the recess extends on the rear side of the printed circuit board substrate opposite the region where a wall of the waveguide adjoins the front side of the printed circuit board substrate. The goal here is to reduce a distance between an area of the back of the printed circuit board substrate and the waveguide. This should be done over the largest possible area of the wall of the waveguide, ideally over its entire area. The resulting structure forms approximately a cup-shaped form, which ultimately forms the shape of a resonator or a resonator shell. In other words, contrary to the known solutions, the geometric shape of a resonator is generated here as negative shape or inversely, i.e., via the rear side of the printed circuit board substrate.

The recess does not necessarily have to have a closed shape, but also various shapes such as grooves, notches, gaps and the like are conceivable. Also, it is not absolutely necessary to implement a closed ring shape, but the recess may, according to one example, consist of several sections, partial arcs or a combination of different shapes. In an example, the recess is designed as an open circular arc or as an open rectangular shape.

The area of the rear side of the printed circuit board substrate which is surrounded by the wall of the recess and a recess which is surrounded by the recess has a microwave-reflecting coating, so that together they form a resonator for the injected microwave signals. In other words, an approximately cup-shaped form, that is to say a so-called resonator shell as the electromagnetic termination of the waveguide, is formed by the recess and the region surrounded by this recess. Together with the reflective coating a resonance in the relevant frequency range results from the geometric shape and the dimensions. In an example, the coating in the recess and the coating are bonded together in the area surrounded by the recess. In another example, the coating in the recess and the coating in the surrounding area are separated.

In an embodiment, the reflective coating is designed as a metallic coating. Metallic coatings can be made of various materials, preferably highly conductive metals, to achieve the electromagnetic and reflective effect. The advantage of metallic coatings can be good contactability and durability. In a further embodiment, plated-through holes are arranged between the front side and the metallic coating in the region of the recess so that the metallic coating can be electrically connected to the waveguide. In other words, an electrical connection is made between the resonator shell and, for example, a metallic wall of the waveguide.

Via the plated-through holes, an electrical connection to the other side of the printed circuit board substrate can be created in each case. In doing so, the stability of the printed circuit board substrate can be maintained and a sufficient quality of the electrical connection can be achieved at the same time by the plated-through holes, for example, designed as electrically conductive and metallized bore. On the front side, a connection between the plated-through holes and the waveguide can be made for example via welded joints or solder joints.

In an embodiment, a distance between two adjacent vias is less than a quarter of the wavelength of the microwaves. This can advantageously prevent a propagation of the microwaves from an inner region of the waveguide or an inner region of the connecting region into regions outside the waveguide. As it were, the respective adjacently arranged plated-through holes act electromagnetically overall like a continuous barrier for the microwaves.

In an embodiment, the region of the rear side enclosed by the recess is lowered toward the front side. For example, this can be done by mechanical removal of this area. This reduces a distance of this area with the microwave-reflective coating to the waveguide. By way of a degree of removal, for example, an electromagnetic tuning of the resonator shell to the frequencies used can take place. In a further embodiment, the recess and/or the area enclosed by the recess are filled with a synthetic resin. This can have the advantage that the original thickness of the printed circuit board substrate can be restored by casting and thus an increased mechanical stability of the entire printed circuit board substrate and the printed circuit board can be achieved. Without this filling, the resonator shell can be mechanically held over the stationary circuit board layer. For example, the degree of depression determines, whether this is practical.

The lowering of the area surrounded by the recess may thus additionally allow for the inclusion of a layer of synthetic resin in the removed area, thus providing additional stability in connection with the resin incorporated in the recess. In an example, a filling with synthetic resin takes place in such a way that an original planar surface shape of the rear side of the printed circuit board substrate is reproduced.

In an embodiment, the connection area and the recess are rectangular. This can have the advantage that it is also possible to fall back on a circular or annular waveguide to rectangular configured cross-sections of waveguides. Accordingly, in a further embodiment, a circular configuration of this connection region and the recess is proposed. In this case, according to a further embodiment, the circuit board may have a plurality of conductor levels, which may be made for example of copper.

According to a further embodiment, the printed circuit board is designed as a Land Grid Array or Ball Grid Array. This may mean, for example, that contact pads are provided on a rear side of the printed circuit board substrate for contacting with further components and assemblies. This can further advantageously allow an embodiment of the printed circuit board in SMD construction. According to one example, connections of the printed circuit board or of the printed circuit board substrate are guided to the rear side of the printed circuit board substrate and connected to contact pads. These can connect other assemblies, for example via solder joints.

According to a further embodiment, the printed circuit board has several conductor levels.

According to a further example, the printed circuit board substrate is surrounded by a plastic. This plastic can advantageously map functions of a housing while achieving stability and small size. According to a further example, the printed circuit board substrate is surrounded by the plastic such that the connection region is recessed. It can thereby be achieved that, in spite of the surrounding plastic, electrical contact and mechanical contact of the waveguide with the plated-through holes or with the printed-circuit substrate is made possible.

According to an embodiment, the printed circuit board on the front side of the printed circuit substrate has a second recess for receiving a high-frequency chip (RF chip), the microwave guide extending between the second recess and the connecting region. In this second recess the semiconductor chip is placed and then sealed with a so-called glob-top or a lid.

By routing the microwave guide on or within the printed circuit board substrate into the inner region of the waveguide, this arrangement is well suited for transmitting microwave signals from an RF chip into a waveguide.

The spatially arranged, for example, in the immediate vicinity of the connection area second recess can thus be used advantageously at low losses and compact mechanical implementation that the circuit board can simultaneously implement the generation of high-frequency electromagnetic signals and the processing of the received RF signals as a functional unit. This can have the advantage that the technically sensitive high-frequency components are combined in a compact manner and self-contained in an assembly and thus can be largely independent of external influences. According to an example, the RF chip may also be arranged on the printed circuit substrate without a second recess. According to an embodiment, the second recess is filled with a synthetic resin. This can advantageously serve the mechanical stability and protection against environmental influences.

According to a further aspect, a method for producing a resonator for microwaves in a printed circuit board is presented. This method first comprises the step of providing a nonconductive planar printed circuit board substrate. In a next step, an annular circumferential recess is produced on a rear side of this printed circuit board substrate. This can consist of several sections according to one example, but may preferably also be designed as a closed ring. This is followed by application of a microwave-reflecting coating on a wall of the recess and on a region of the rear side of the printed circuit board substrate enclosed by the recess. This may be, for example, a metallic layer, wherein various methods for applying metallic layers on surfaces of printed circuit substrate are known. In one example, only a partial area of the wall and/or a partial area of the area enclosed by the recess are provided with a metallic or at least reflective coating.

In a further step, plated-through holes are produced between a front side of the printed circuit substrate and the reflective coating in the recess, wherein the plated-through holes are arranged on the front side such that a face side of the waveguide end can be electrically connected to the plated-through holes. These plated-through holes can be designed, for example, as tubular bores with subsequent metallization. In an embodiment of the method, generating the recess further includes removing printed circuit board substrate for lowering a region enclosed by the recess toward the front side.

As a result, for example, the final shape and dimension of the resonator, for example in the course of an electromagnetic tuning, are produced. This may also be done by adjusting the shape and size of the recess on the rear side of the circuit board substrates, as an example.

In an embodiment of the method, producing recess and/or the surrounding area takes place by means of milling. This method can have efficiency advantages while at the same time producing the desired shapes comparatively accurately with the small dimensions prevailing here. According to a further embodiment of the method, filling of the recess and/or the area enclosed by the recess takes place with a synthetic resin. For this purpose, for example, heated and liquid synthetic resin can be applied by casting or spraying, for example via a via-filling process, to the printed circuit substrate and so the removed or milled areas are compensated. The advantage here is improved stability, since predetermined breaking points can be avoided by thinner points and at the same time the resin can undergo a mechanically stable and permanent connection to the printed circuit board substrate.

It should be understood that features of the method as described above and below may also be features of the circuit board and vice versa.

BRIEF DESCRIPTION OF THE FIGURES

Embodiments will be described in detail below with reference to the accompanying drawings.

The drawings are only schematic and not to scale. Basically, identical or similar parts are provided with the same reference numerals.

DETAILED DESCRIPTION OF EMBODIMENTS

Figure 1:
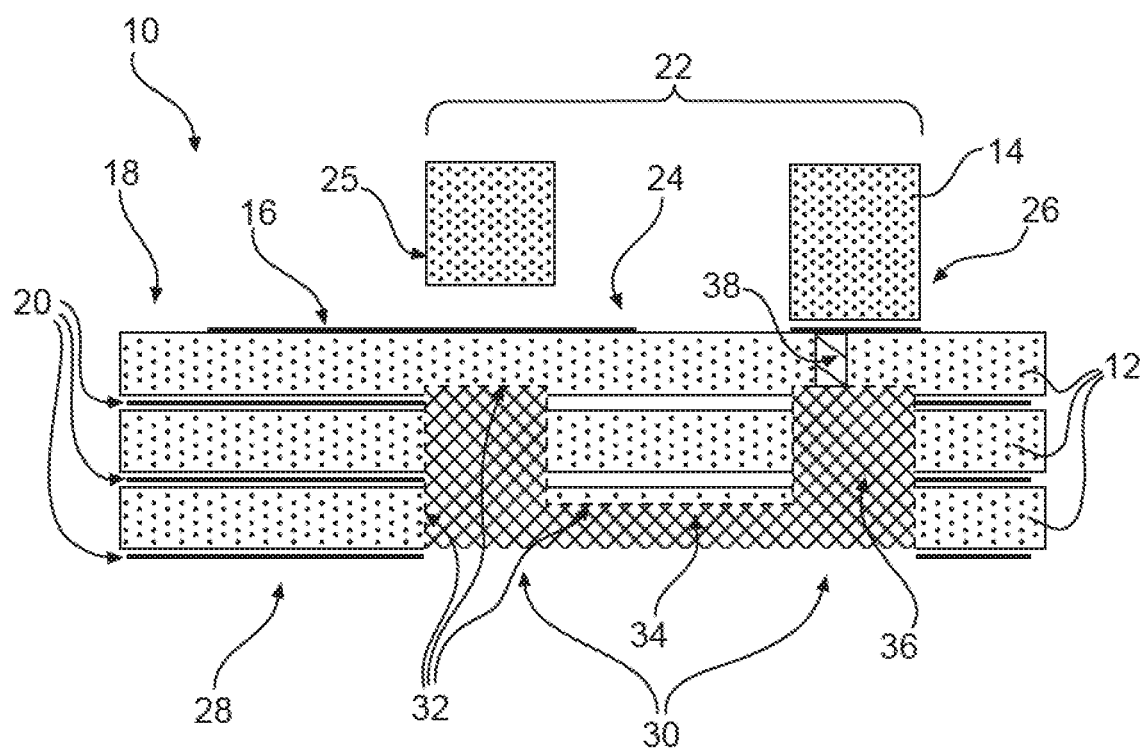
FIG. 1 shows a partial region of a circuit board in a cross-sectional view.

FIG. 1 shows a partial region of a printed circuit board 10 for coupling a waveguide 14. A microwave guide 16 is arranged on a printed circuit substrate 12. In the example shown here, the microwave guide 16 extends on a surface of the printed circuit board substrate 12, here on a front side 18. According to an example (not shown here), the microwave guide 16 is guided in an interior of the printed circuit board substrate 12. This may have the advantage that, contrary to the representation in FIG. 1, no additional separation or shortening of the waveguide 14 is necessary for the purpose of insulation at this point, but rather the waveguide 14 has a circumferential plane or flat termination with the advantage of simplified manufacture (for example truncate).

The printed circuit board substrate 12 is made of an RF-neutral or for high frequencies in the relevant area insulating material, such as liquid crystal polymer (LCP) or a polytetrafluoroethylene (PTFE) substrate of various manufacturers. Within the printed circuit board substrate 12 a plurality of conductor levels 20 are arranged to map the corresponding electrical connections of an electronic circuit. A connection region 22 describes the region on the front side 18 of the printed circuit board substrate 12, opposite to the waveguide 14 or where the waveguide 14 is connected to the printed circuit board substrate 12. This connection region 22 is annular, so that it can receive a front end 26 of the waveguide 14. According to an example, the connection region 22 is rectangular. Thus, for example, the connection of also rectangular waveguides 14 is possible. It should be noted that the most varied cross-sectional shapes of waveguides 14 and connecting regions 22 are possible, wherein it makes sense that the wall of the waveguide 14 and the connecting region 22 overlap or are directly opposite each other.

One end of the microwave guide 24 protrudes into the connection region 22, so that microwave signals can pass from the microwave guide 16 or via the end of the microwave guide 24 into the waveguide 14 and vice versa. In other words, the end 24 of the microwave guide 16 acts like a transmitting and receiving antenna, which emits microwave signals into the waveguide 14 and can receive microwave signals from the waveguide 14. On a rear side 28 of the printed circuit board substrate 12, a circumferential recess corresponding to the cross-sectional area of the waveguide 14 is arranged opposite the annular connecting region 22. In the following figures, the spatial configurations of this recess are illustrated.

On a wall of the recess 30, a metallic coating 32 is applied, which is shown here as a dashed line. In principle, in addition to metallic coatings, other types of coatings or substances are generally possible which have a reflective effect for microwaves in the gigahertz range of relevance here. This may include, for example, fluids or even gases that have corresponding physical properties or elements such as ions. Metallic coatings 32 may be advantageous here, since they can be produced with known methods at relatively low cost and provide a good reflective effect. In an example, the recess 30 has a width of about 1 mm and a depth and length in the range of less than 1 mm. The dimensions are based on the frequency range of the microwaves used. In one example, a thickness of a metallic coating 32 is about a few microns.

A lowered region 34 is surrounded by the recess 30 and forms together with the recess 30 on its side facing the front side 18 a resonator or resonator shell in cooperation with the waveguide 14. The lowered portion 34 can, according to an example, also have a metallic coating 32 without lowering. The reduction here has the advantage that the resulting space together with the recess can be potted with a synthetic resin 36 and thus a stability of the circuit board 10 can be increased. Instead of synthetic resin other filling and stabilizing and durable materials such as plastics, adhesives, fillers or the like can be used.

Plated-through holes 38 are provided in the printed circuit board substrate 12, which are arranged such that they produce an electrical connection between, for example, a metallic wall of the waveguide 14 and the metallic coating 32 on the rear side 28 of the printed circuit board substrate 12. This can also be done, for example, in that the plated-through holes contact a subregion of a conductor plane 20, which in turn is in electrical contact with the waveguide 14. In this case, the waveguide 14 may be attached to the printed circuit board 10 and the printed circuit board substrate 12, respectively, by various mechanisms, for example by soldering, welding or gluing.

Figure 2:
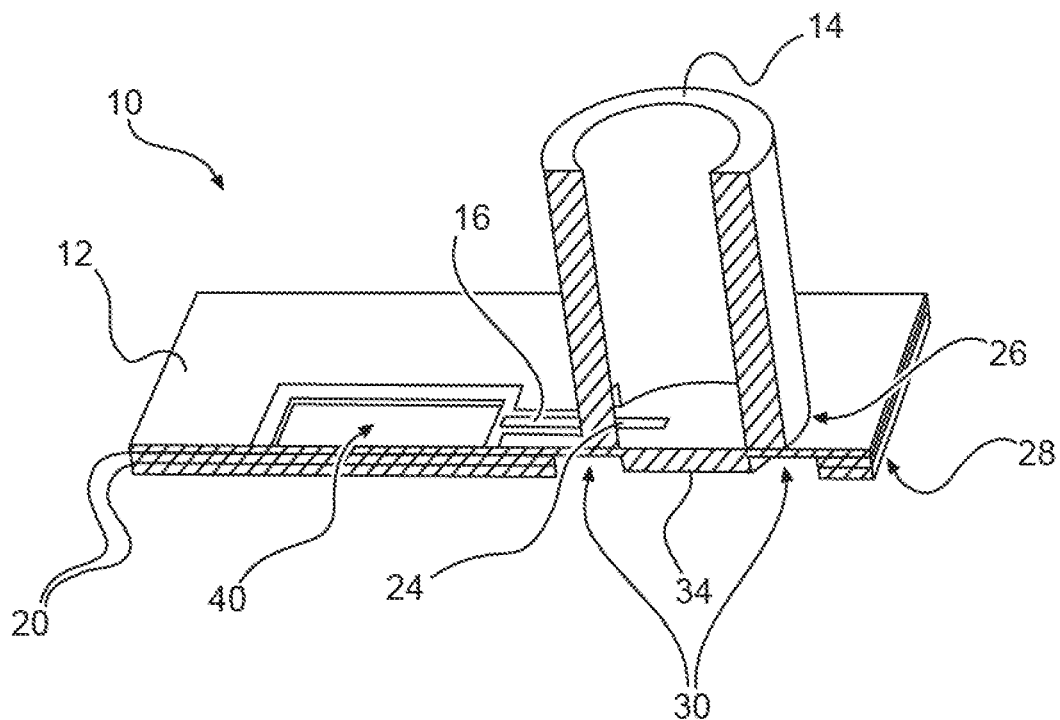
FIG. 2 shows a three-dimensional sectional view of a printed circuit board with a waveguide.

In FIG. 2, a circuit board 10 with a waveguide 14 is shown in a sectional view. A printed circuit board substrate 12 has a plurality of conductor levels 20. On a rear side 28 of the printed circuit board substrate 12, an annular circumferential recess 30 is introduced. Here, it is easy to see that the recess extends opposite the front end 26 of the waveguide 14 on the rear side 28 of the printed circuit board substrate 12. A diameter of a lowered region 34 here corresponds approximately to an inner diameter of the waveguide 14. The end 24 of a microwave guide 16 protrudes into the interior of the waveguide 14 and is thereby guided insulated from the wall of the waveguide 14. For example, a recess may be provided in the wall of the waveguide 14 for this purpose. As another example, the microwave guide 16 is routed within the printed circuit board substrate, which may eliminate the need for a recess.

In a further region of the front side 18 of the printed circuit board substrate 12, a second recess 40 is provided for receiving an RF chip (not shown). In particular, due to the inverse or rear-side production of the resonator by the recess 30 and the metallic coating 32, the microwave conductor 16 can advantageously lead into the connection region 22 or the inner region of the waveguide 14. This can advantageously enable an adjacent arrangement of high-frequency electronics and thus be implemented space-saving. The second recess 40 may be potted with a synthetic resin to increase mechanical stability and reliability.

Figure 3:
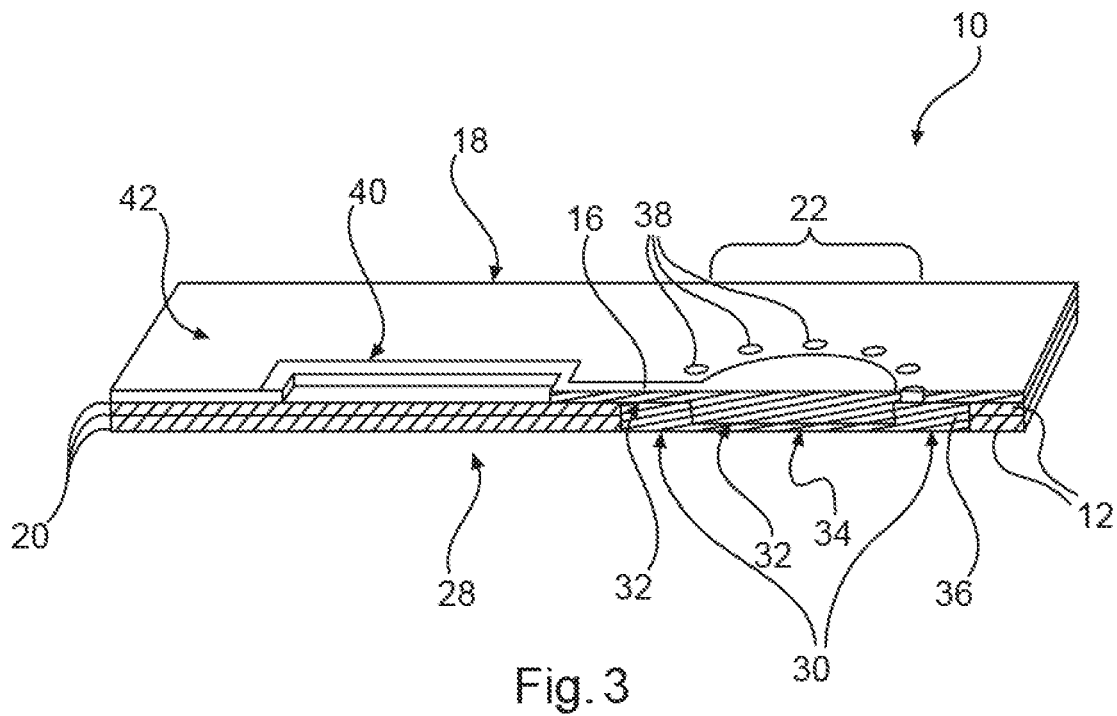
FIG. 3 shows a printed circuit board with a plurality of conductor levels and a second recess.

FIG. 3 shows a further exemplary embodiment of a printed circuit board 10 with a printed circuit board substrate 12 and with a plurality of conductor levels. Also in this example, a recess 30 filled with synthetic resin 36 is present on a rear side 28 of the printed circuit board substrate 12, forming a resonator for a waveguide (not shown) adjoining the opposite front side 18. A microwave guide 16 extends between a second recess 40 and a connecting region 22. Plated-through-holes 38 serve to establish an electrical connection between a metallic coating 32 in the recess 30 with the lowered region 34 surrounded by the recess and a connectable waveguide 14 (not shown). In one example, two adjacent through-holes 38 are spaced apart with a distance less than one quarter of the wavelength of the microwaves. As a result, microwaves can be prevented from escaping between the plated-through holes, thus resulting in unwanted losses.

Figure 4:
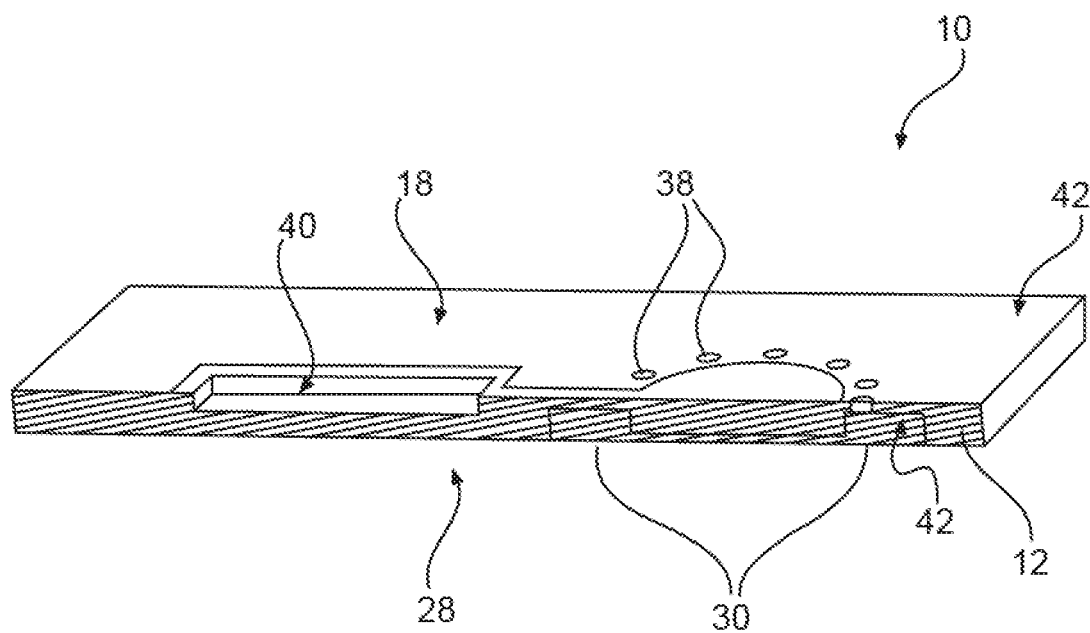
FIG. 4 shows a printed circuit board in a simplified version without conductor levels.

FIG. 4 shows a simplified variant of a printed circuit board 10, with a printed circuit board substrate 12 without conductor levels 20. This may allow easily configured and therefore inexpensive starting materials to be used for the printed circuit board substrate 12. For the purpose of shielding, a metallic layer 42 may be applied to a front side 18 of the printed circuit board substrate 12. Here, too, the plated-through holes 38 can be seen, which electrically connect a metallic layer 42 to the front side 18 of the printed circuit board substrate 12.

Figure 5:
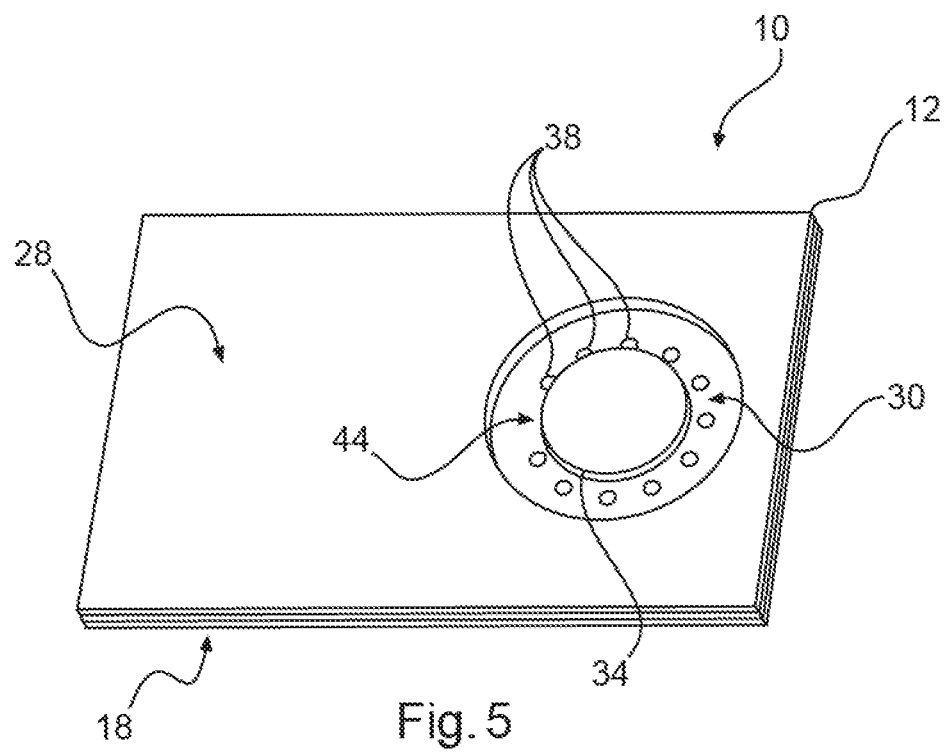
FIG. 5 shows a rear side of a printed circuit board with a circular encircling recess and plated-through holes.

FIG. 5 shows a simplified example of a printed circuit board 10, wherein a view of a rear side 28 of a printed circuit board substrate 12 is shown here. A circular shaped circumferential recess 30, which includes a lowered portion 34, is clearly visible. In this case, plated-through holes 38 are likewise arranged in a circular manner in the recess 30. In the area where a microwave guide (not shown) is conducted on a front side 18 of the printed circuit board substrate 12 in the connecting region (not visible here) overleaf of the lowered region 34, a larger gap 44 is arranged between the plated through holes 38 for passing through the microwave conductor 16.

Figure 6:
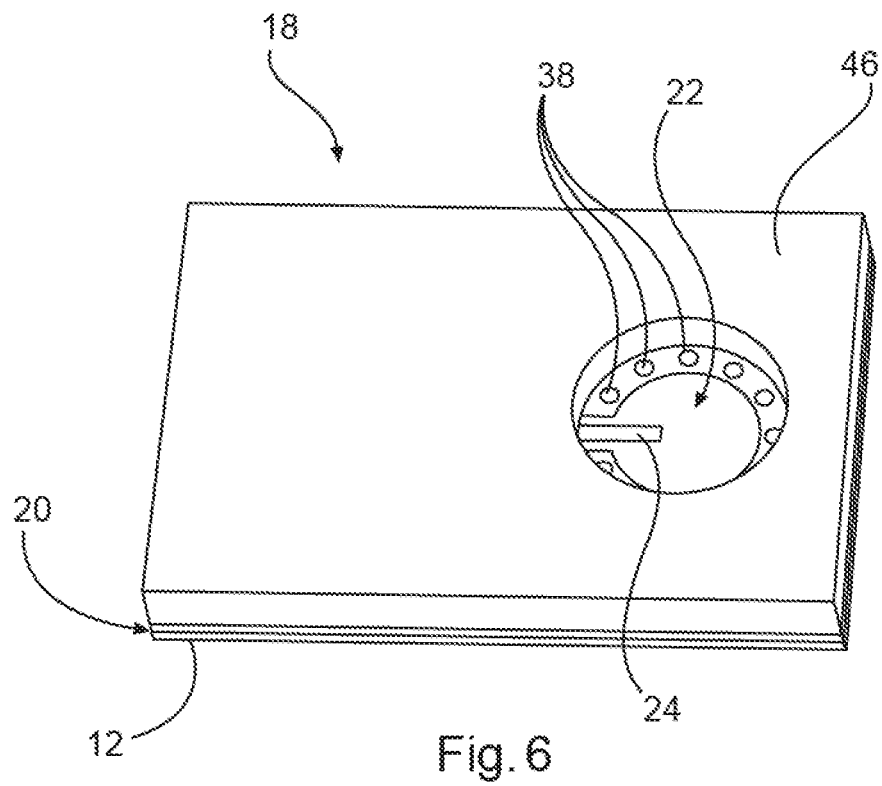
FIG. 6 shows a front side of a printed circuit board with a plastic housing and recessed area for a waveguide.

FIG. 6 shows an exemplary embodiment of a printed circuit board 10, which has a printed circuit board substrate 12 with a plurality of conductor levels 20. A visible front side 18 of the printed circuit board substrate 12 is surrounded by a plastic 46, which serves as a housing by its stabilizing effect. In this case, the connection region 22 with plated-through holes 38 and one end of a microwave conductor 24 is recessed in such a way that a tubular waveguide 14 (not shown) can be fastened to the front side 18 of the printed circuit substrate with the plated-through holes 38. In an example, the circuit board is implemented as a Land Grid Array (LGA). For this purpose, according to an example, the connections of an RF chip can be routed via lines and plated-through holes of bonding pads to the rear side 28 of the printed circuit board substrate 12 and connected there, for example, to soldering pads (not shown).

Figure 7:
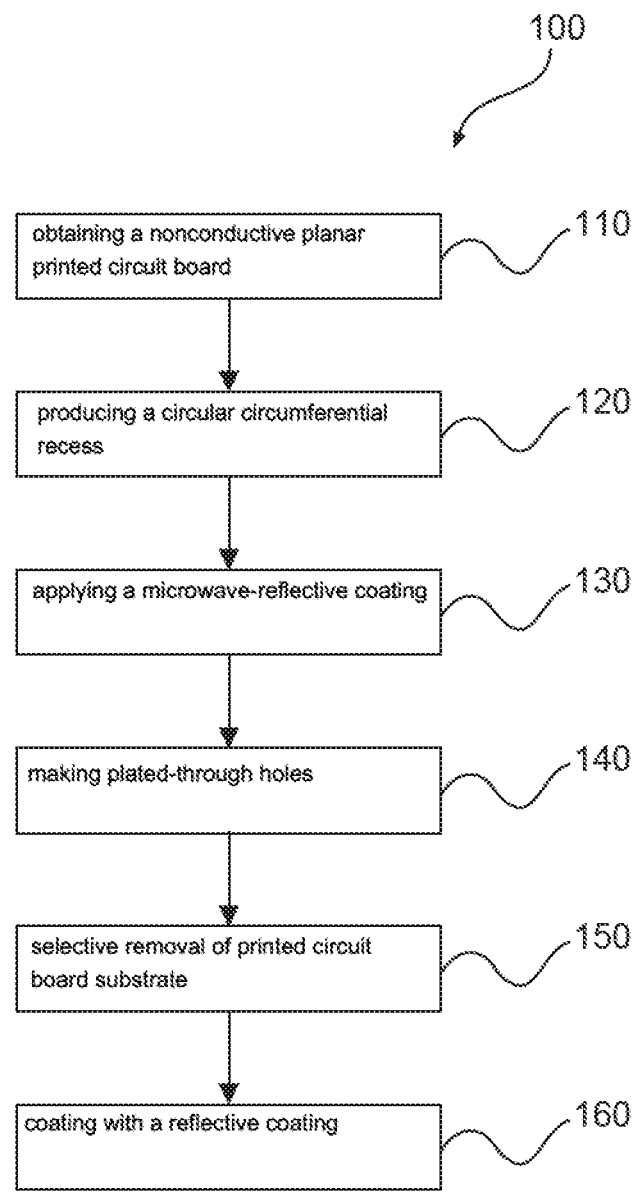
FIG. 7 shows a method for producing a resonator for microwaves in a printed circuit board.

FIG. 7 shows by way of example a method 100 for producing a resonator for microwaves in a printed circuit board 10. First, a provision 110 of a nonconductive planar printed circuit board substrate 12 takes place. On a rear side 28 of the printed circuit board substrate 12, in the next step 120, a circular circumferential recess 30 is produced. This can be done, for example, by milling or similar methods. In a following step 130, a microwave-reflective coating is applied in this recess 30 and onto a region 34 (lowered area) enclosed by the recess 30 on the rear side 28 of the printed circuit substrate 12. In an example, the reflective coating is a metallic coating 32.

In an example, the reflective coating of the recess 30 and the reflective coating of the depressed area 34 on the rear side 28 are electrically connected together. Thereafter, in a step 140, plated-through holes 38 are made. These run between the front side of the printed circuit board substrate 12 and the reflective coating or metallic layer 42 in the recess 30, wherein the plated-through holes 30 are arranged on the front side 18 such that a face side of a waveguide 14 can be electrically connected to the plated-through holes 38. Optionally, in addition, a step 150 of the selective removal of printed circuit board substrate 12 for lowering a region 32 enclosed by the recess 30 toward the front side 18 can take place. This can be done for example by milling. The recess 30 and/or the area enclosed by the recess can be coated with a reflective coating in step 160 and stabilized by filling with a synthetic resin. This can be done for example by a via-filling process.

In addition, it should be noted that "encompassing" does not exclude other elements or steps, and "a" or "an" does not exclude a multitude. It should also be appreciated that features or steps described with reference to any of the above embodiments may also be used in combination with other features or steps of other embodiments described above. Reference signs in the claims are not to be considered as limiting.

The invention claimed is:

1. A printed circuit board for a radar level measurement device, comprising
   a non-conductive planar printed circuit board substrate; and
   a microwave conductor configured to couple a microwave signal into a waveguide arranged on the printed circuit board substrate,
   wherein, a circumferential connecting region, configured to receive a front-side end of a waveguide, is arranged on a front side of the printed circuit substrate,
   wherein one end of the microwave conductor projects into the circumferential connecting region so that microwave signals are able to pass from the microwave conductor into the waveguide and vice versa,
   wherein a circumferential recess in the direction of the waveguide is arranged on a rear side of the printed circuit board substrate opposite to the circumferential connecting region, and
   wherein a wall of the circumferential recess and a region of the rear side of the printed circuit board substrate, surrounded by the circumferential recess, have a microwave-reflective coating so that together the wall of the circumferential recess and the region of the rear side of the printed circuit board substrate form a resonator for injected microwave signals,
   wherein plated-through holes are arranged in a region of the circumferential recess between the front side and the metallic coating so that the metallic coating is electrically connectable to the waveguide, and
   wherein a distance between two adjacent plated-through holes is less than a quarter of a wavelength of the microwave signals.

2. The printed circuit board according to claim 1, wherein the reflective coating is a metallic coating.

3. The printed circuit board according to claim 1, wherein the region of the rear side enclosed by the circumferential recess is lowered towards the front side.

4. The printed circuit board according to claim 1, wherein the circumferential recess and/or a region enclosed by the circumferential recess is filled with another material.

5. The printed circuit board according to claim 1, wherein the circumferential connecting region and the circumferential recess are circular.

6. The printed circuit board according to claim 1, wherein the circumferential connecting region and the circumferential recess have a rectangular shape.

7. The printed circuit board according to claim 1, wherein the printed circuit board on the front side of the printed circuit board substrate has a second recess configured to receive an RF chip and the microwave conductor extends between the second recess and the circumferential connecting region.

8. The printed circuit board according to claim 7, wherein the second recess is filled with a synthetic resin.

9. A radar level measuring device, comprising:
   a printed circuit board according to claim 1.

10. The printed circuit board according to claim 2, wherein plated-through holes are arranged in a region of the circumferential recess between the front side and the metallic coating so that the metallic coating is electrically connectable to the waveguide.

11. The printed circuit board according to claim 2, wherein the region of the rear side enclosed by the circumferential recess is lowered towards the front side.

12. The printed circuit board according to claim 2, wherein the circumferential recess and/or a region enclosed by the circumferential recess is filled with another material.

13. The printed circuit board according to claim 2, wherein the circumferential connecting region and the circumferential recess are circular.

14. The printed circuit board according to claim 2, wherein the circumferential connecting region and the circumferential recess have a rectangular shape.

15. A printed circuit board for a radar level measurement device, comprising
   a non-conductive planar printed circuit board substrate; and
   a microwave conductor configured to couple a microwave signal into a waveguide arranged on the printed circuit board substrate,
   wherein, a circumferential connecting region, configured to receive a front-side end of a waveguide, is arranged on a front side of the printed circuit substrate,
   wherein one end of the microwave conductor projects into the circumferential connecting region so that microwave signals are able to pass from the microwave conductor into the waveguide and vice versa,
   wherein a circumferential recess in the direction of the waveguide is arranged on a rear side of the printed circuit board substrate opposite to the circumferential connecting region, and
   wherein a wall of the circumferential recess and a region of the rear side of the printed circuit board substrate, surrounded by the circumferential recess, have a microwave-reflective coating so that together the wall of the circumferential recess and the region of the rear side of the printed circuit board substrate form a resonator for injected microwave signals, wherein the region of the rear side enclosed by the circumferential recess is lowered towards the front side.

16. A printed circuit board for a radar level measurement device, comprising a non-conductive planar printed circuit board substrate; and a microwave conductor configured to couple a microwave signal into a waveguide arranged on the printed circuit board substrate, wherein, a circumferential connecting region, configured to receive a front-side end of a waveguide, is arranged on a front side of the printed circuit substrate, wherein one end of the microwave conductor projects into the circumferential connecting region so that microwave signals are able to pass from the microwave conductor into the waveguide and vice versa, wherein a circumferential recess in the direction of the waveguide is arranged on a rear side of the printed circuit board substrate opposite to the circumferential connecting region, and wherein a wall of the circumferential recess and a region of the rear side of the printed circuit board substrate, surrounded by the circumferential recess, have a microwave-reflective coating so that together the wall of the circumferential recess and the region of the rear side of the printed circuit board substrate form a resonator for injected microwave signals, wherein the printed circuit board on the front side of the printed circuit board substrate has a second recess configured to receive an RF chip and the microwave conductor extends between the second recess and the circumferential connecting region.

* * * * *